United States Patent [19]

VanVonno et al.

[11] Patent Number: 5,071,792

[45] Date of Patent: Dec. 10, 1991

[54] PROCESS FOR FORMING EXTREMELY THIN INTEGRATED CIRCUIT DICE

[75] Inventors: Nicolaas W. VanVonno; Dyer A. Matlock, Melbourne, both of Fla.

[73] Assignee: Harris Corporation, Melbourne, Fla.

[21] Appl. No.: 613,091

[22] Filed: Nov. 5, 1990

[51] Int. Cl.⁵ ............................................ H01L 21/463
[52] U.S. Cl. .................................... 437/227; 156/645; 437/209; 437/974; 437/249
[58] Field of Search .............. 437/227, 226, 228, 209, 437/974, 249; 156/645; 141/DIG. 51, DIG. 28

Primary Examiner—Olik Chaudhuri
Assistant Examiner—Steve Kutz
Attorney, Agent, or Firm—Evenson, Wands, Edwards, Lenahan & McKeown

[57] ABSTRACT

A wafer processing technique separates an extremely thin wafer into a plurality of completed circuit-containing dice without having to directly handle the wafer. In one embodiment, a substrate is thinned by forming a trench pattern in its top surface, the trench depth being the intended thickness of the die. A polishing resistant material is then formed in the trench and planarized down to a topside passivating layer, which is patterned to expose surface test regions. After wafer-probe testing, the wafer is affixed face-down on a support handle by means of an adhesion material such as wax. The substrate is backside-lapped down to the stop material in the trench, leaving a thin wafer layer. After the trench material is removed. Individual dice are separated from the support handle by melting the wax. In a further embodiment, a thin wafer layer if formed on a buried oxide layer. After trench patterning and face-down wax-mounting, the support substrate is polished down to the buried insulator layer. The buried oxide layer is then etched off. The dice are removed by heating the wax. In another embodiment, an etch resistant material is formed on the passivating layer and on the sidewalls of the trench, with a floor portion of the trench pattern exposing the buried oxide. An etchant is then applied to the buried oxide by way of the exposed floor portion of the trench pattern, so as to etch away the buried oxide, thereby lifting off the dice from the support substrate.

28 Claims, 7 Drawing Sheets

PROCESS FOR FORMING EXTREMELY THIN INTEGRATED CIRCUIT DICE

FIELD OF THE INVENTION

The present invention relates in general to the manufacture of integrated circuits and is particularly directed to a technique for processing extremely thin semiconductor wafers within which integrated circuits are formed and separating the wafer into individual dice.

BACKGROUND OF THE INVENTION

The use of advanced packaging techniques for integrated circuits technologies sometimes requires that the completed semiconductor wafer be extremely thin (on the order of one to five mils thick). Unfortunately, wafers this thin are so fragile that they easily break when handled or processed by conventional methods. A typical technique for forming a thin wafer is diagrammatically illustrated in the sequence of FIGS. 1 and 2, which depict a semiconductor wafer 11 supported by an underlying 'handle' substrate 15. Wafer 11 contains a plurality of integrated circuit regions 13 and is insulated from substrate 15 by way of an intervening oxide layer 17 (FIG. 1). To separate wafer 11 into individual dice, the wafer is patterned, for example, by way of a reactive ion etch to form a trench 21 down to the surface of oxide layer 17. The underlying handle layer is then removed by grinding, followed by an etch wash of the oxide layer, leaving only the thin wafer and oxide. Handling of the resulting structure (which may have a diameter up to five inches) is very difficult and may damage the devices.

SUMMARY OF THE INVENTION

In accordance with the present invention, the above discussed problem is solved by a wafer processing technique through which an extremely thin wafer is able to be separated into a plurality of completed circuit-containing dice without having to handle the wafer in a thinned condition. In accordance with a first embodiment of the present invention, rather than form a thin wafer atop a handle that is removed immediately after wafer processing has been completed, the wafer is initially made sufficiently thick to form a support substrate beneath the thin portion of the wafer where the circuit devices are to be formed. After circuit formation and the deposition of a passivating layer on the topside surface of the wafer, a trench pattern is etched into the substrate to a depth that defines the desired thickness of the dice. Namely, the top surface of the wafer to a depth on the order of one to five mils, for example. A layer of a relatively hard material, namely one that has a resistance to polishing greater than that of the trench, but does not necessarily fill the trench. For a silicon wafer, a material such as silicon nitride, tungsten or silicon carbide is suitable for this purpose. The passivating layer is then patterned, so as to expose surface areas of integrated circuit components for wafer probe testing. After the circuits have been tested, the wafer is affixed face-down on a separate flat support member (handle) by means of a temporary attachment material such as wax.

With the wafer mounted in its inverted configuration, its thickness is then reduced all the way down to the bottom of the trench (to the nitride layer) by removing material from its exposed surface (e.g. by grinding) until the nitride is encountered. The 1 trench nitride material is then removed, thereby separating the thinned wafer into a plurality of semiconductor dice that are supported by way of the handle. The individual dice may then be separated from the support handle by melting the wax.

Pursuant to another embodiment of the invention, after a passivating overcoat layer has been formed on a first surface of the semiconductor wafer in which a plurality of integrated circuit components have been formed, a trench pattern is etched through the passivating layer and into the wafer to a depth which defines the intended thickness of semiconductor circuit-containing dice to be obtained from the wafer. The trench pattern is then completely filled with a trench fill material, the resistance of which to physical removal (e.g. mechanical polishing) is greater than that of the semiconductor wafer. Again, as in the first embodiment, the passivating layer is selectively patterned to expose surface areas of the integrated circuit components for wafer-probe testing. After testing, the wafer is affixed, face-down, to a planar support handle by way of a readily removable adhesion material (e.g. wax). The thickness of the wafer is then reduced by mechanical polishing its back surface down to a level which exposes the trench fill material. The trench fill material is then removed from the trench pattern, thereby dividing the wafer into a plurality of semiconductor dice that are supported by way of the handle. By melting the wax the dice are then separated from the handle.

In a modification of this embodiment, the fill material in the trench may be formed by non-selectively depositing a first thin buffer layer on the patterned wafer, followed by the non-selective deposition of a second layer of fill material which completely fills the remainder of the trench pattern. The fill material is then planarized down to the surface of the passivating layer, so that the fill material remains only in the trench. When such a multiple fill material is employed, the first layer of fill material may comprise a nitride layer and the second layer may comprise tungsten or silicon carbide.

After, the face-down mount and backside removal of the original substrate down to the level of the polishing stop fill material in the trench, the dice may be removed by etching the first layer of fill material, so that the second layer of fill material may be lifted out, thereby separating the wafer into a plurality of dice.

In a further embodiment of the present invention, a thin (one to five mils) wafer layer has a buried insulator layer formed beneath the integrated circuit components that have been introduced through the top surface of the wafer, and a support substrate underlies the buried insulator layer. A trench pattern is formed through the circuit passivating layer and through the wafer down to the buried insulator layer. A layer of wax is non-selectively deposited over the patterned structure, the wax filling the trench, and the waxed structure is then mounted face-down on a separate, flat support handle. The support handle is then thinned by, for example, a grind/polish/etch step down to the buried insulator layer. This buried insulator layer effectively performs the same polish 'stop' function as the trench-resident material in the previous embodiments. The buried insulator layer is then etched off, exposing the trench wax matrix. By heating the handle, the wax is softened, so that the dice may be easily lifted out.

In accordance with a modification of this latter embodiment of the invention, in which a buried insulator layer is formed beneath said integrated circuit components in the thin wafer layer, after forming a trench pattern through the passivating layer and the wafer layer down to the buried insulator layer, so as to divide th wafer layer into a plurality of semiconductor dice tha. re supported on the buried insulator layer, an etch resistant material is selectively formed on both the passivating layer and on the sidewalls of the trench pattern, leaving floor portion of the trench pattern which exposes the buried insulator layer. An etchant is then applied to the buried insulator layer by way of the exposed floor portion of the trench pattern, so as to etch away the buried insulator layer and thereby lift off the plurality of dice from the support substrate beneath the buried insulator layer.

Preferably, the buried insulator layer is doped with impurities which accelerate the etching of the buried insulator layer. For this purpose, the buried insulator layer may comprise an oxide layer heavily doped with phosphorus and the etchant comprises a concentrated hydrogen fluoride etchant solution. By immersing the structure resulting from the formation of the etchant resistant material on the sidewalls of the trench pattern in an etchant solution, the buried insulator layer is etched by way of the exposed floor portion of the trench pattern, thereby separating the plurality of semiconductor dice from the support substrate beneath the buried insulator layer.

DETAILED DESCRIPTION

Figure 1:
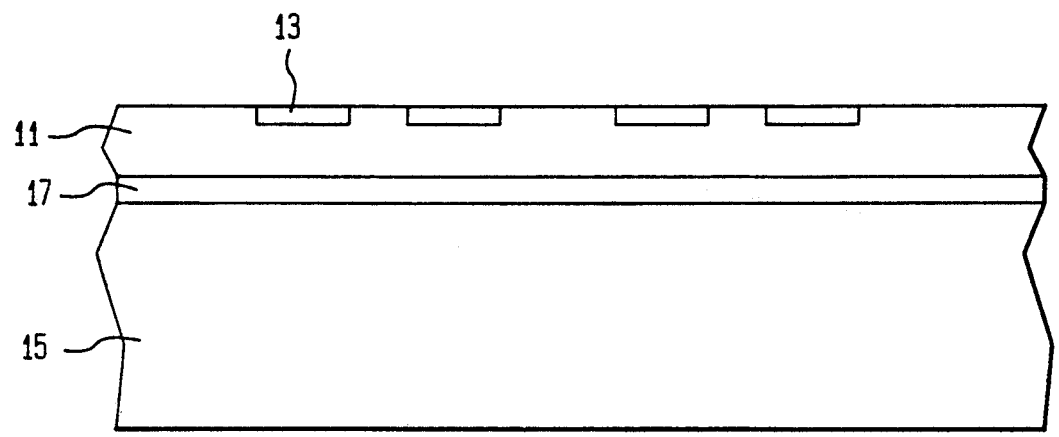
FIGS. 1 and 2 diagrammatically illustrate a conventional method for processing a thin integrated circuit wafer into a plurality of dice.
Figure 2:
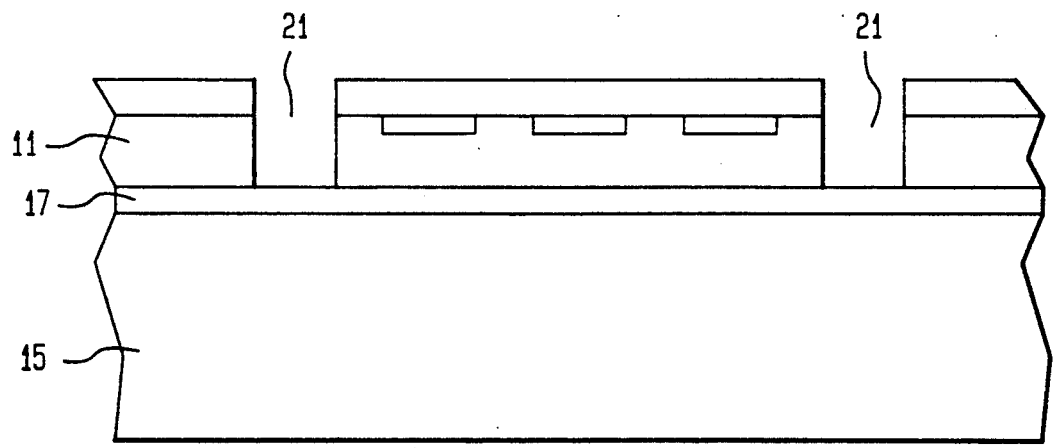
Figure 3:
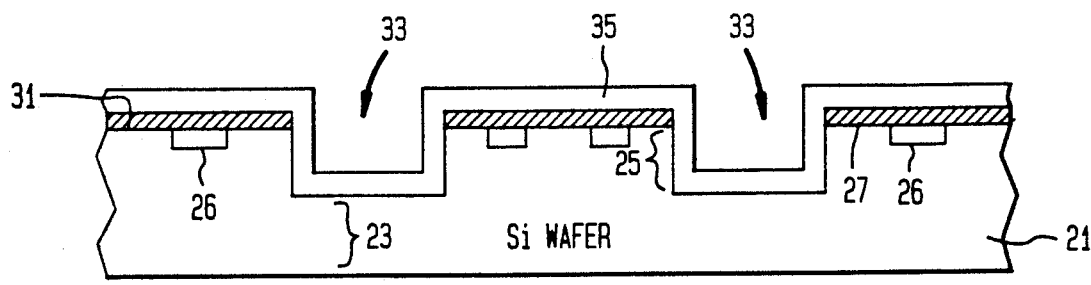
FIGS. 3-6 are diagrammatic cross-sections of a semiconductor wafer at respective steps of its manufacture in accordance with a first embodiment of the present invention.

Referring now to FIGS. 3-6, diagrammatic cross-sections of a semiconductor wafer at respective steps of its manufacture in accordance with a first embodiment of the present invention are (e.g. silicon, gallium arsenide) having a thickness on the order of 20 mils, which is sufficiently thick to form a handle region 23 beneath a thin portion 25 of the wafer in which circuit devices 26 have been formed. After deposition of a passivating overcoat layer 27 on the topside planar surface 31 of the wafer, a trench pattern 33 (which delineates the individual dice that are to be eventually removed from the wafer) is formed, so as to extend through passivating overcoat layer 27 and into the wafer to the depth 25 of the desired thickness of a completed die. For the one to five mil thickness range referenced above, trench 33 has a depth in that range and a width on the order of two to four mils. A layer 35 of a relatively hard material, namely one that has a resistance to mechanical polishing greater than that of the wafer, is then non-selectively deposited over the patterned wafer to a thickness on the order of one mil. For a silicon wafer, a material such as silicon nitride, tungsten or silicon carbide is suitable for this purpose. It should be observed that these materials are given as non-limiting examples, and other materials having like functional properties may be used.

Figure 4:
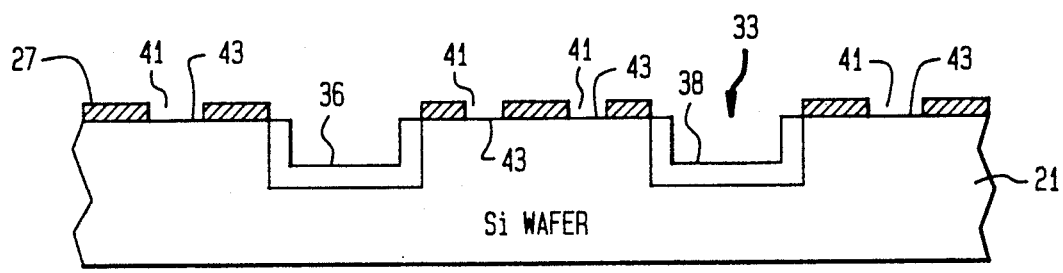

Layer 35 is then planarized by selective etching, so as to remove the polishing material from passivating overcoat layer 27, but leaving layer 35 partially filling the trench pattern, as shown by trench coat layers 36 and 38 which are deposited on the floor and sidewall portions of the trench pattern, as shown in FIG. 4. Passivating overcoat layer 27 is then selectively patterned to form a plurality of apertures 41 which to expose surface regions 43 of integrated circuit components for wafer-probe testing of the devices. If a tape automated bonding process is employed, a suitable soft metal, such as indium, may be deposited on regions 43 by conventional electroplating.

Figure 5:
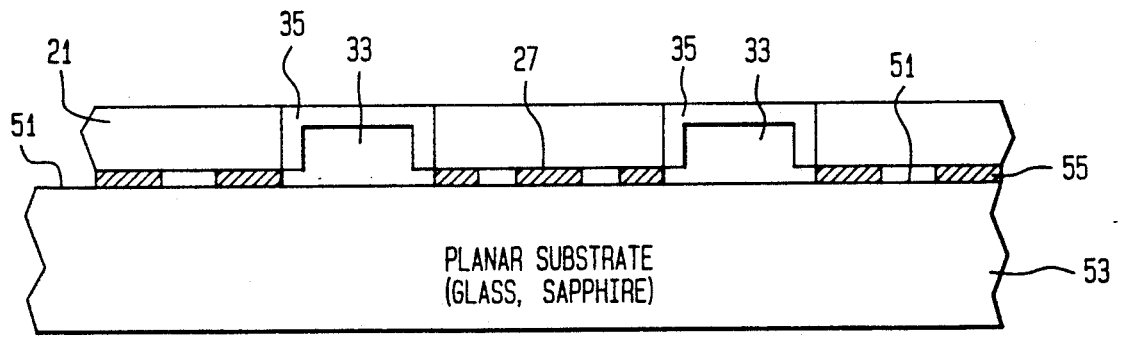

After the circuits have been tested, wafer 21 is inverted and, using conventional beam-lead attachment techniques, affixed face-down on the planar surface 51 of a support member (handle) 53, such as glass or sapphire, as shown in FIG. 5. One standard attachment material is a thin film 53 of heated wax which provides temporary adhesion between passivating overcoat 27 and the planar surface 51 of support handle 55. With wafer 21 mounted in its inverted configuration, its thickness is reduced by a conventional mechanical grind/lap and polish sequence (which may be followed by a suitable KOH etc.) that 'thins' the wafer down to the trench nitride layer 35. Because layer 35 is a hard, dense material, when encountered during the polishing operation, it significantly retards removal of the wafer material, so that it acts as a polish stop. At this point in the process, the thickness of wafer 21 is that desired (corresponding to the trench depth 25).

Figure 6:
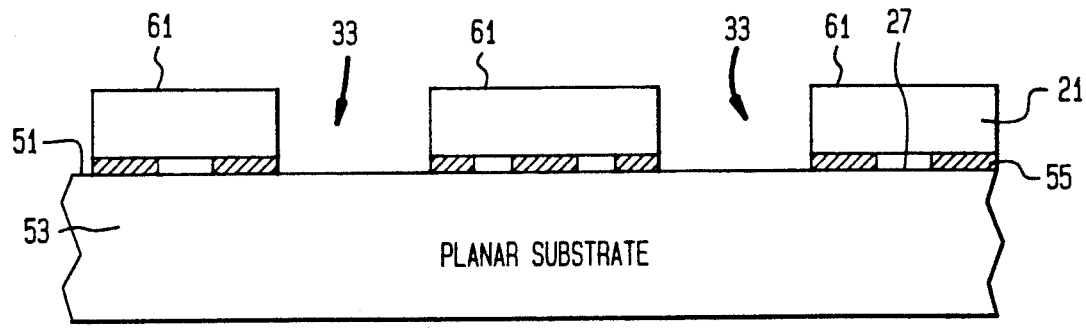

The lap and polish stop layer 35 is then removed (e.g. in the case of a nitride layer by a nitride etch), thereby effectively 'cleaning out' the trench pattern 33, as shown in FIG. 6, so that a plurality of semiconductor dice 61 are separated from one another and supported by way of handle 53. The individual dice 61 may now be readily separated from the support handle by simply melting wax film 55.

Figure 7:
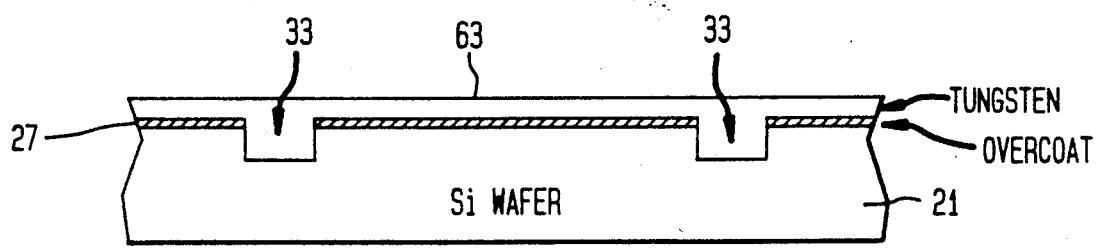
FIGS. 7-10 are diagrammatic cross-sections of a semiconductor wafer at respective steps of its manufacture in accordance with a second embodiment of the present invention.
Figure 8:
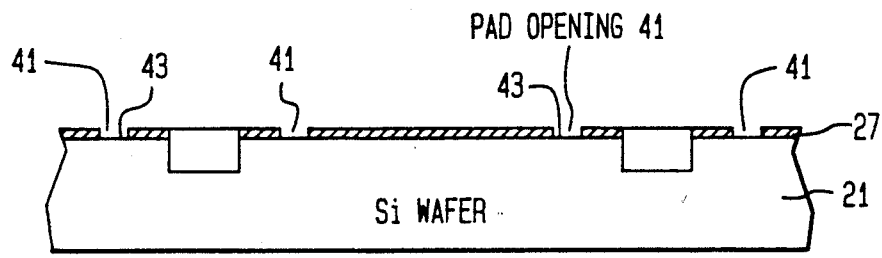

A second embodiment of the invention is diagrammatically shown in FIGS. 7-10. As in the first embodiment, a trench pattern 33 is again etched through passivating overcoat layer 27 and into wafer 21 to a depth which defines the intended thickness of semiconductor circuit-containing dice to be obtained from the wafer. A layer 63 of polish resistant material, such as any of those referred to above, is then non-selectively deposited over the trench-patterned wafer. Unlike the first embodiment, in which layer 35 was deposited to only partially fill the trench pattern, here layer 63 is deposited to a thickness sufficient to completely fill the trench, as shown in FIG. 7. Layer 63 is then planarized by a conventional etch back process, such as wet etch, plasma etch, reactive ion etch, etc., so as to perform a smooth etching of layer 63 down to the surface of passivating overcoat layer 27, leaving layer 63 even with the top layer 27, as shown in FIG. 8. Passivating overcoat layer 27 is then selectively patterned, as in the first embodiment, to form a plurality of apertures 41 which to expose surface regions 43 of integrated circuit components (not shown for clarity) for wafer-probe testing of the devices.

Figure 9:
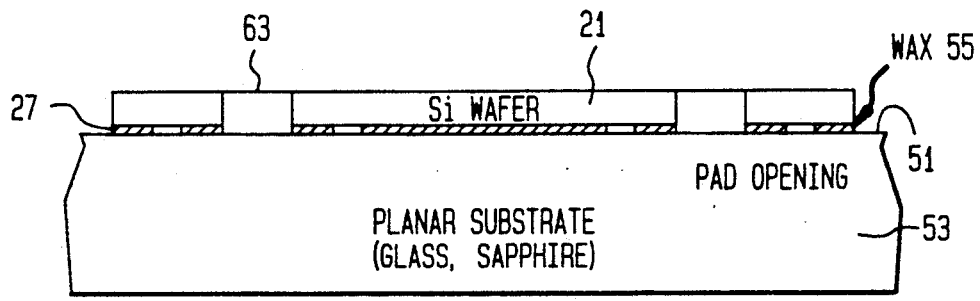

After the circuits have been tested, wafer 21 is inverted and, as shown in FIG. 9, mounted face-down on the planar surface 51 of a support handle 53, using a suitable adhesion material, such as a wax film 55, as in the previous embodiment. The thickness of mounted wafer 21 is then reduced, for example, by a mechanical grind/lap and polish sequence that thins the wafer down to the trench fill layer 63. Again, since layer 63 is a hard, dense material, when encountered during the polishing operation, it significantly retards removal of the wafer, so that it acts as a grind/polish stop. At this point in the process, the thickness of the wafer corresponds to the trench depth.

Figure 10:
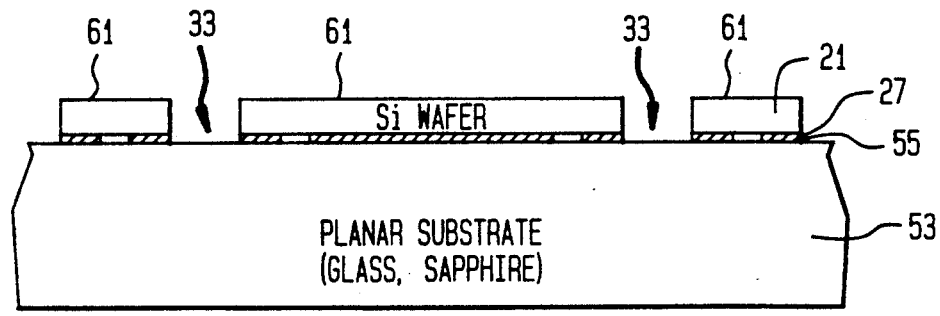

Once the thinning process is complete, trench fill layer 63 is removed by a trench etch, thereby effectively cleaning out the fill material from the trench pattern, so that a plurality of spaced-apart semiconductor dice 61 remain supported by way of handle 53, as shown in FIG. 10. The individual dice 61 may now be readily separated from the support handle by simply melting wax film 55.

Figure 11:
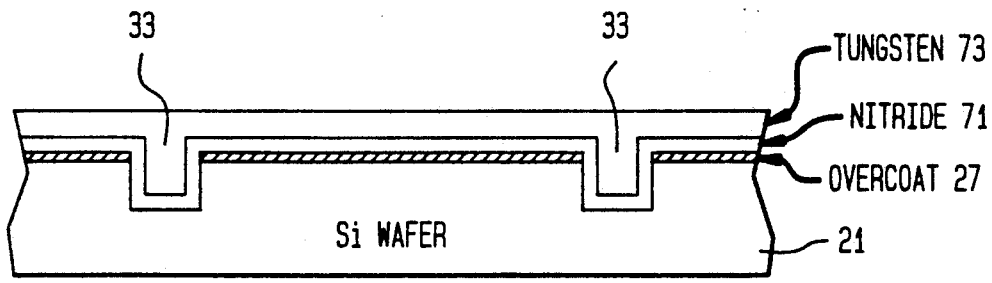
FIGS. 11-14 are diagrammatic cross-sections of a semiconductor wafer at respective steps of its manufacture in accordance with a third embodiment of the present invention.
Figure 12:
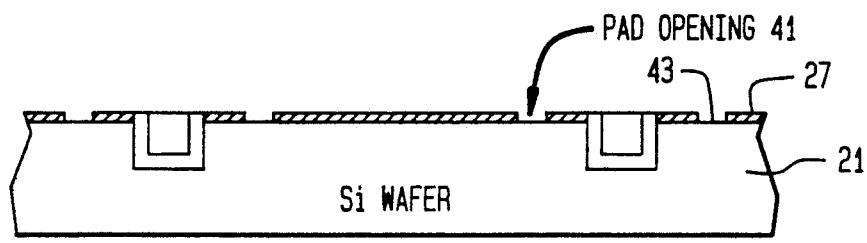

A third embodiment of the present invention is diagrammatically illustrated in FIGS. 11-14. As in the first and second embodiments, a trench pattern 33 is etched through a passivating overcoat layer 27 and into wafer 21 to a depth which defines the intended thickness of semiconductor circuit-containing dice to be obtained from the wafer. However, in place of a single polish stop trench deposit, an initial buffer layer 71, such as silicon nitride, is non-selectively deposited over the patterned wafer, prior to depositing a trench fill layer 73, such as tungsten. Buffer layer may have a thickness on the order of 3000 to 5000 Å. Depositing buffer layer 71 prior to filling the trench pattern with the polish stop material allows for the removal of the polish stop layer from the trench pattern in the event no satisfactory selective etch chemistry (etch stop material to silicon) is available during subsequent processing. As in the second embodiment, fill layer 73 is deposited to a thickness sufficient to completely fill the trench, as shown in FIG. 11. The resulting surface laminate of layers 71 and 73 is then thinned down to the surface of passivating overcoat layer 27, leaving layer 73 even with the top layer 27, as shown in FIG. 12. Passivating overcoat layer 27 is then selectively patterned, as in the previous embodiments, to form wafer probe apertures 41.

Figure 13:
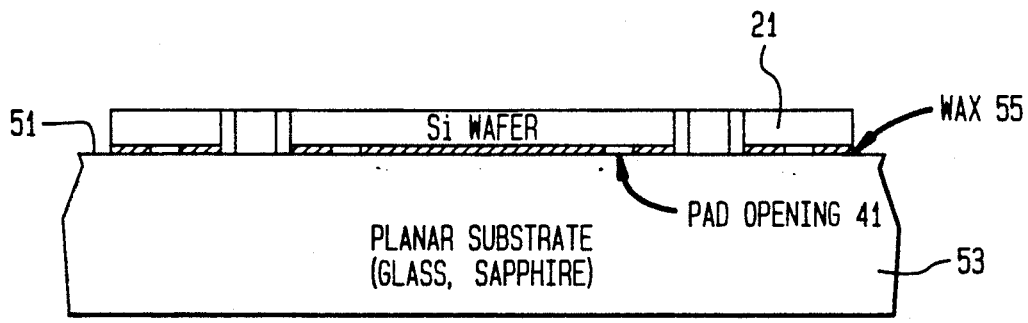
Figure 14:
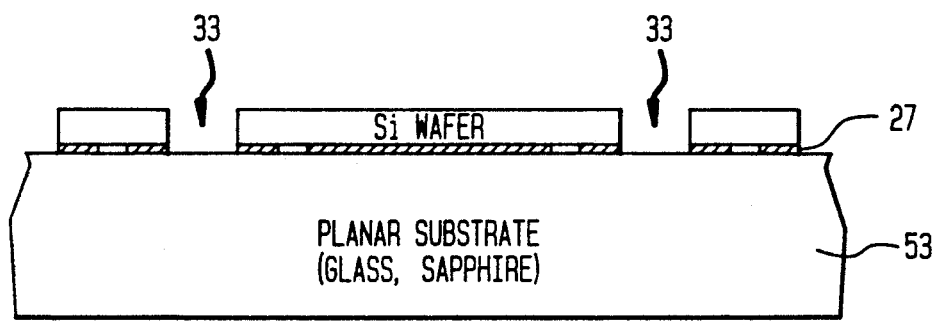

After the circuits have been tested, wafer 21 is inverted and, as shown in FIG. 13, mounted face-down on the planar surface 51 of a support handle 53, using a suitable adhesion material, such as a wax film 55, as in the previous embodiments. The thickness of mounted wafer 21 is then reduced by a mechanical grind/lap and polish sequence that thins the wafer down to the trench fill polishing stop material 73. Once the thinning process is complete, the nitride buffer layer 71 is etched away, causing tungsten fill layer 73 to be lifted out, leaving plural spaced-apart semiconductor dice 61 supported by way of handle 53, as shown in FIG. 14. The individual dice 61 may now be readily separated from the support handle by melting wax film 55.

Figure 15:
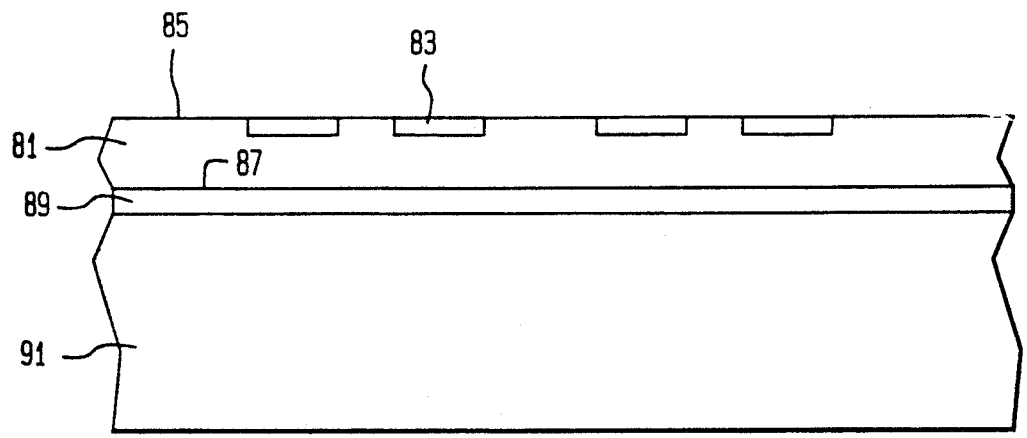
FIGS. 15-19 are diagrammatic cross-sections of a semiconductor wafer at respective steps of its manufacture in accordance with a fourth embodiment of the present invention.

In each of the above-described embodiments of the invention the semiconductor wafer was obtained by thinning a bulk substrate. In accordance with a fourth embodiment of the present invention diagrammatically illustrated in FIGS. 15-19, the wafer to be processed is constituted by a thin wafer layer atop buried insulator layer (e.g. oxide layer) within a substrate structure. More particularly, as shown in FIG. 15, a thin (one to five mils) planar wafer layer 81 having a plurality of circuit regions 83 in its top planar surface 85 is contiguous, at its bottom surface 87, with a buried insulator (e.g. oxide) layer 89. Buried oxide layer 89 is contiguous with an underlying support substrate 91. Buried oxide layer 89 may be formed by a number of conventional techniques, including, but not limited to, wafer bonding, oxygen ion implantation (SIMOX processing), or zone-melt recrystallization. Its thickness may lie in a range of 5000 to 10,000 Å. In each case, the depth at which oxide layer 89 is buried will define the thickness of wafer layer 81 and thereby the eventual die thickness. Because, buried oxide layer 89 covers the entire bottom surface 87 of wafer layer 91, it effectively serves as an etch stop during the thinning process to be performed. This not only improves the precision of the thinning process, but makes tight control of the variations in the etch process less critical.

Figure 16:
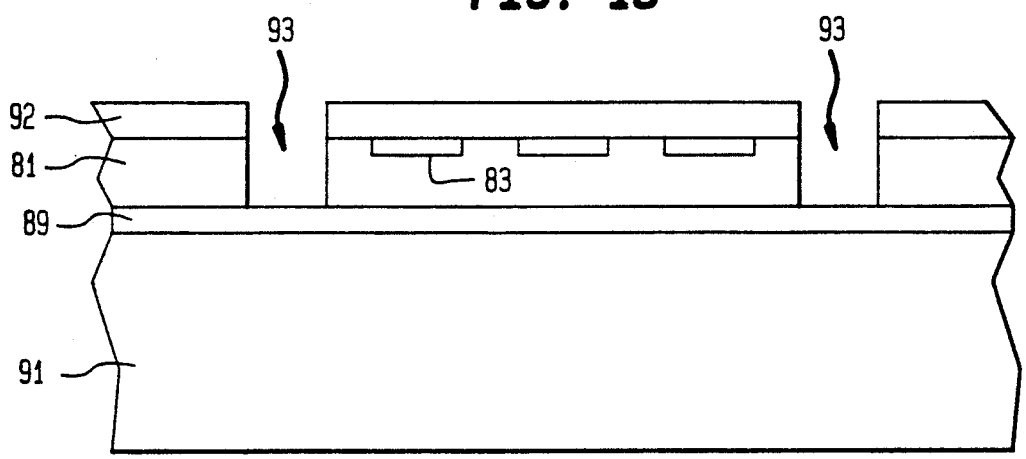
Figure 17:
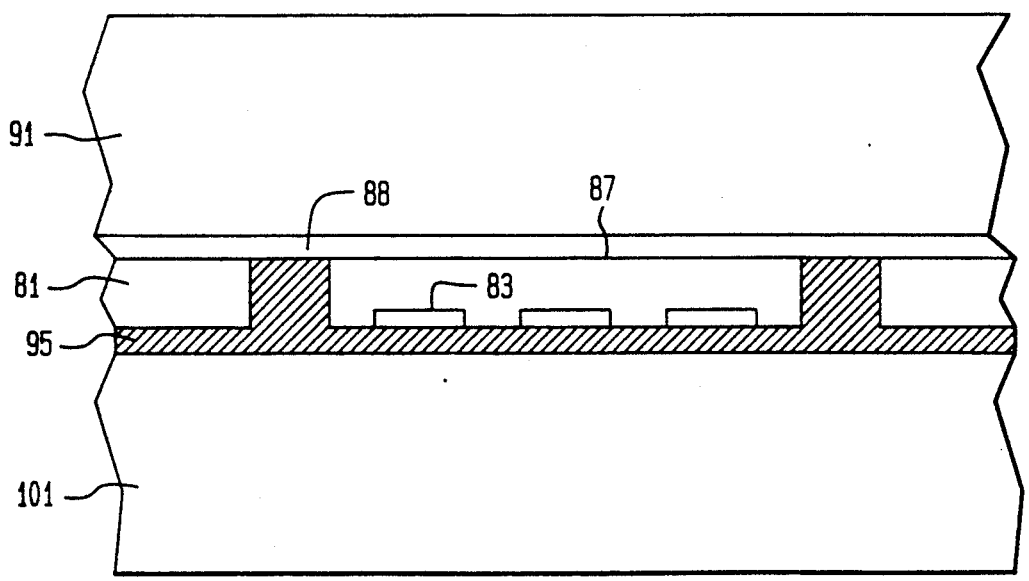

As in the previous embodiments, after a passivating overcoat layer 92 has been formed on the top planar surface 85 of wafer layer 81, a trench pattern 93 is formed through passivating layer 92 and through wafer layer 91 down to buried insulator layer 89, as illustrated in FIG. 16. Because buried oxide layer 89 serves as the polishing stop, it is unnecessary to fill the trench pattern 93 with a stop material. Instead, the entire top surface of the structure shown in FIG. 16 is non-selectively waxed (the wax layer 95 filling the trench pattern) and the resulting structure is mounted face-down on a support handle 101, as shown in FIG. 17.

Figure 18:
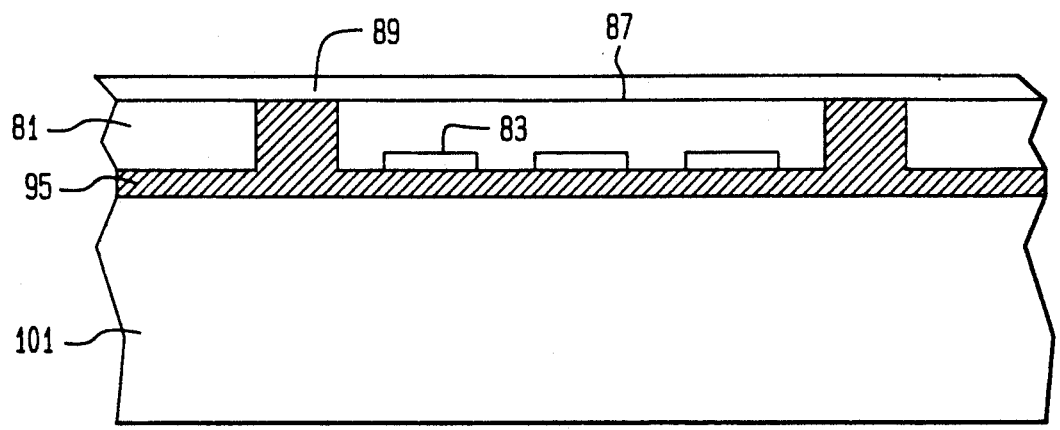
Figure 19:
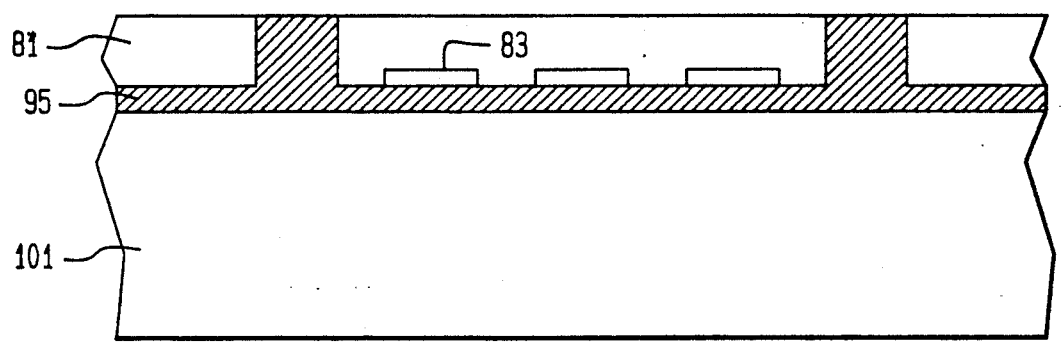

As illustrated in FIG. 18, substrate 91 is then mechanically and chemically polished down to buried insulator layer 89 which, as noted above, effectively performs the same polish stop function of the nitride layer in the previous embodiments. Oxide layer 89 is then etched off, for example by means of a conventional buffered HF etch, leaving a plurality of integrated circuit dice embedded in a wax matrix, as shown in FIG. 19. The dice may then be removed by heating the support handle 101, which softens the wax so that the dice may be pulled out of the matrix.

Figure 20:
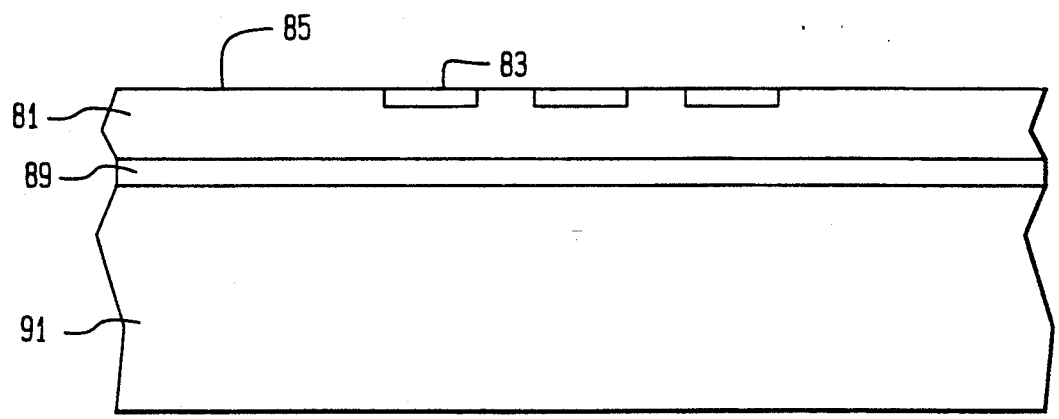
FIGS. 20-22 are diagrammatic cross-sections of a semiconductor wafer at respective steps of its manufacture in accordance with a fifth embodiment of the present invention.
Figure 21:
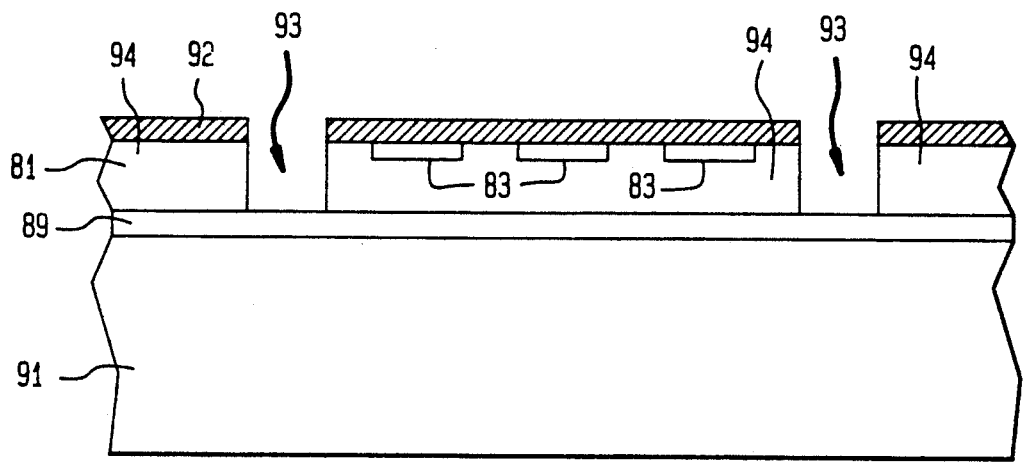
Figure 22:
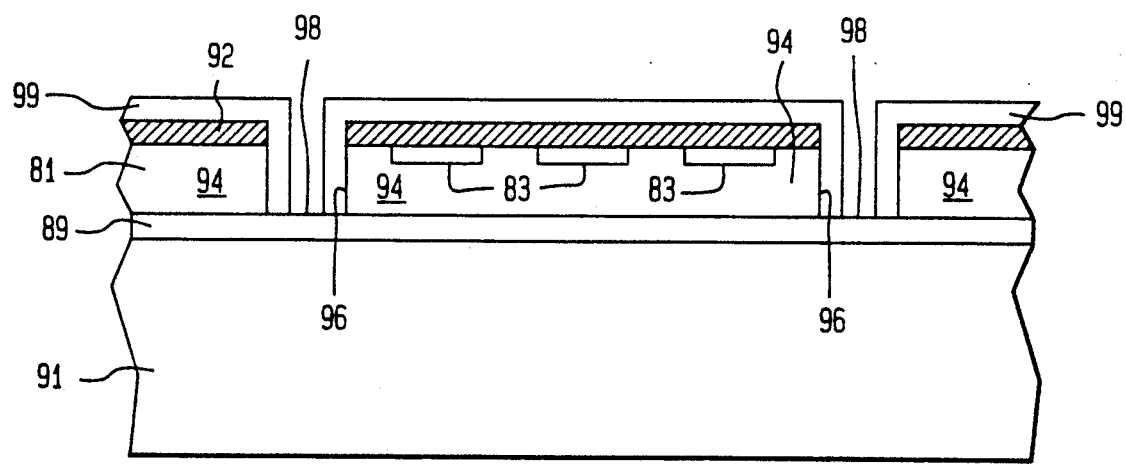

In accordance with a fifth embodiment of the invention, shown in the sequence of FIGS. 20-22, the configuration of the semiconductor structure again has a buried insulator layer 89 formed beneath a thin surface wafer layer 81 containing integrated circuit components 83 in its top planar surface 85 (FIG. 20). In the present embodiment, buried insulator layer is preferably doped with a etch accelerator, such as phosphorus. As in the fourth embodiment, a trench pattern 93 is formed through surface passivating overcoat layer 92 and the through wafer 81 layer down to buried oxide layer 89, thereby dividing wafer layer 81 into a oxide layer 89 (FIG. 21).

Next, as shown in FIG. 22, a layer 99 of oxide etch resistant material, such as silicon nitride is selectively formed on the structure of FIG. 21, so that it effectively encapsulates each of the dice 94, coating both passivating layer 92 and sidewalls 96 of the trench pattern. Nitride layer 99 is selectively formed so that a floor portion 98 of the trench pattern remains uncoated, thereby exposing the buried insulator layer at that surface region. The structure is then immersed in an oxide etchant, such as a concentrated HF solution, which attacks oxide layer 89 via exposed floor portion 98 of the trench pattern, so as to etch away the buried oxide layer and thereby lift-off the plurality of dice 94 from the underlying support substrate 91. Because buried oxide layer 89 is doped with impurities (p...osphorus) which accelerate the action of the HF etch, oxide layer 89 is readily removed.

As will be appreciated from the foregoing description, regardless of the configuration of the original substrate, the dice patterning and removal techniques of the respective embodiments of the present invention make it unnecessary to handle the wafer throughout its processing sequence thereby substantially preventing damage to the integrated circuit-containing dice.

While we have shown and described several embodiments in accordance with the present invention, it is to be understood that the same is not limited thereto but is susceptible to numerous and we therefore do not wish to be limited to the details shown and described herein but intend to cover all such changes and modifications as are obvious to one of ordinary skill in the art.

What is claimed:

1. A method of manufacturing a semiconductor device comprising the steps of:
   (a) providing a semiconductor substrate containing integrated circuit components formed in a first surface thereof and having a passivating layer formed on said first surface of said substrate overlying said integrated circuit components;
   (b) forming a trench pattern through said passivating layer into said first surface of said substrate;
   (c) forming a layer of a prescribed material in said trench pattern;
   (d) selectively patterning said passivating layer to expose surface areas of said integrated circuit components;
   (e) mounting said semiconductor substrate on a support member such that the first surface of said semiconductor substrate faces said support member;
   (f) removing material from a second surface of said semiconductor substrate, opposite to said first surface, so as to effect a thinning of said substrate down to a level which exposes said prescribed material in said trench pattern;
   (g) removing said prescribed material from said trench pattern, thereby leaving a plurality of spaced apart semiconductor dice that are supported by way of said support member; and
   (h) removing said plurality of dice from said support member.

2. A method according to claim 1, wherein step (e) comprises joining said semiconductor substrate to said support member by way of a layer of adhesion material that adheres said support member to said passivating layer, and step (h) comprises separating said plurality of dice from said support member by relieving the adhering property of adhesion material.

3. A method according to claim 2, wherein said adhering material comprises wax and step (h) comprises melting said wax.

4. A method according to claim 1, wherein step (d) includes the step of testing said integrated circuit components by way of exposed surface areas of said integrated circuit components.

5. A method according to claim 1, wherein step (c) comprises filling said trench pattern with a fill material the resistance of which to physical removal is greater than that of said semiconductor substrate.

6. A method according to claim 5, wherein step (c) comprises non-selectively depositing one or more layers of fill material on the structure resulting from step (b) so as to fill said trench pattern with said fill material.

7. A method according to claim 6, wherein said fill material contains at least one of silicon nitride, tungsten and silicon carbide.

8. A method according to claim 5, wherein step (c) comprises non-selectively depositing a first layer of fill material on the structure resulting from step (b), so as to form said first layer of fill material in said trench and on said passivating layer, and non-selectively depositing a second layer of fill material on said first layer of fill material, so as to fill the remainder of said trench pattern with said second layer of fill material, and thereafter removing said first and second layers of fill material down to the surface of said passivating layer, so that said first and second layers of fill material remain in said trench pattern.

9. A method according to claim 8, wherein said first layer of fill material comprises silicon nitride and said second layer of fill material includes tungsten or silicon carbide.

10. A method according to claim 8, wherein step (g) comprises etching said first layer of fill material so as to cause said second layer of fill material to be lifted out.

11. A method according to claim 1, wherein step (c) comprises forming, as said layer of prescribed material, a layer of etchable material on floor and wall portions of said trench pattern.

12. A method of manufacturing a semiconductor device comprising the steps of:
   (a) providing a planar semiconductor wafer having integrated circuit components formed in a first surface thereof and a passivating overcoat layer formed on said first surface of said semiconductor wafer overlying said integrated circuit components;
   (b) forming a trench pattern through said passivating layer to a depth in said wafer which defines the intended thickness of semiconductor circuit-containing die to be obtained from said wafer;
   (c) filling said trench pattern with a trench fill material the resistance of which to physical removal is greater than that of said semiconductor wafer;
   (d) selectively patterning said passivating layer to expose surface areas of said integrated circuit components and testing said integrated circuit components by way of their exposed surface areas;
   (e) adhering said planar semiconductor wafer, first surface down, onto a planar support member;
   (f) removing, by mechanical polishing, material from a second surface of said planar semiconductor wafer, opposite to said first surface, so as to effect a thinning of said wafer down to a level which exposes said trench fill material;
   (g) removing said trench fill material from said trench pattern, so that a plurality of spaced-apart semiconductor dice are supported by way of said support member; and
   (h) removing said plurality of dice from said support member.

13. A method according to claim 12, wherein step (e) comprises joining said semiconductor wafer to said support member by way of a layer of adhesion material that adheres said support member to the passivating layer of said wafer, and step (h) comprises separating said plurality of dice from said support member by relieving the adhering property of said layer of adhesion material.

14. A method according to claim 13, wherein step (c) comprises non-selectively depositing a first layer of fill material on the structure resulting from step (b) so as to form said first layer of fill material in said trench and on said passivating layer, and non-selectively depositing a second layer of fill material on said first layer of fill material, so as to fill said trench pattern with said first and second layers of fill material and form said first and second layers of fill material on said passivating layer, and thereafter removing said first and second layers of fill material from said passivating layer, so that said first and second layers of fill material remain in said trench pattern.

15. A method according to claim 14, wherein said first layer of fill material comprises nitride and said second layer of fill material comprises tungsten or silicon carbide.

16. A method according to claim 14, wherein step (g) comprises etching said first layer of fill material so as to cause said second layer of fill material to be lifted out.

17. A method according to claim 12, wherein said trench fill material is one selected from the group consisting of silicon, carbide and tungsten.

18. A method according to claim 12, wherein step (c) comprises non-selectively depositing a nitride layer on the structure resulting from step (b) so as to form said nitride layer in said trench and on said passivating layer, and removing said nitride layer from said passivating layer, so that said nitride layer is formed only in said trench pattern.

19. A method according to claim 18, wherein step (c) the structure resulting from step (b) so as to form said buffer layer in said trench and on said passivating layer, non-selectively depositing a further polishing stop layer on said nitride layer, so as to fill said trench pattern with polishing stop layer and form said polishing stop layer on said passivating layer, and thereafter removing said polishing stop layer and said buffer nitride layer from said passivating layer, so that said buffer nitride layer and said polishing stop layer remain as a fill layer in said trench pattern.

20. A method according to claim 19, wherein said further polishing stop layer comprises tungsten or silicon carbide.

21. A method of manufacturing a semiconductor device comprising the steps of:
(a) providing a substrate having a semiconductor layer containing integrated circuit components formed in a first planar surface thereof, a passivating layer being formed on said first planar surface so as to extend over integrated circuit components therebeneath, and having a buried insulator layer formed beneath said integrated circuit components, said substrate having material beneath said buried insulator layer;
(b) forming a trench pattern through said passivating layer and the thickness of said semiconductor layer down to said buried insulator layer;
(c) filling said trench pattern with a prescribed trench fill material;
(d) mounting the structure resulting from step (c) on a layer faces said support member;
(e) removing said material of said substrate beneath said buried insulator layer so as to expose said buried insulator layer;
(f) removing said buried insulator layer, thereby exposing said trench fill material in said trench pattern;
(g) removing said trench fill material from said trench pattern, so that a plurality of spaced apart semiconductor dice are supported by way of said support member; and
(h) removing said plurality of dice from said support member.

22. A method according to claim 21, wherein step (c) comprises removing said passivating layer and non-selectively forming said trench fill material on said first surface of said semiconductor layer and in said trench pattern.

23. A method according to claim 22, wherein said trench fill material comprises a layer of adhesion material that adheres said support member to said first surface of said semiconductor layer, and step (h) comprises separating said plurality of dice from said support member by relieving the adhering property of said adhesion material.

24. A method according to claim 23, wherein said adhesion material comprises wax and step (h) comprises melting said wax.

25. A method of manufacturing a semiconductor device comprising the steps of:
(a) providing a substrate having a semiconductor layer containing integrated circuit components formed in a first planar surface thereof, a passivating layer being formed on said first planar surface so as to extend over integrated circuit components therebeneath, and having a buried insulator layer formed beneath said integrated circuit components, said substrate having material beneath said buried insulator layer;
(b) forming a trench pattern through said passivating layer and the thickness of said semiconductor layer down to said buried insulator layer, so as to separate said semiconductor layer into a plurality of semiconductor dice supported on said buried insulator layer;
(c) forming etch resistant material on said passivating layer and on sidewalls of said trench pattern, with a floor portion of said trench pattern exposing said buried insulator layer; and
(e) applying an etchant to said buried insulator layer by way of the exposed floor portion of said trench pattern, so as to etch 1 away said buried insulator layer and thereby remove said plurality of semiconductor dice from substrate material beneath said buried insulator layer.

26. A method according to claim -25, wherein said buried insulator layer is doped with impurities that accelerate the etching of said buried insulator layer by said etchant.

27. A method according to claim 26, wherein said buried insulator layer comprises an oxide layer heavily doped with phosphorous and said etchant comprises a concentrated hydrogen fluoride etchant solution.

28. A method according to claim 25, wherein step (e) comprises immersing the structure resulting from step (d) in an etchant solution, so as to etch said buried insulator layer by way of the exposed floor portion of said trench pattern, and thereby remove said plurality of semiconductor dice from substrate material beneath said buried insulator layer.

* * * * *